United States Patent
Bhavnagarwala et al.

(10) Patent No.: US 6,977,519 B2
(45) Date of Patent: Dec. 20, 2005

(54) DIGITAL LOGIC WITH REDUCED LEAKAGE

(75) Inventors: Azeez J. Bhavnagarwala, Newtown, CT (US); Suhwan Kim, Nanuet, NY (US); Daniel R. Knebel, Mahopac, NY (US); Stephen V. Kosonocky, Wilton, CT (US)

(73) Assignee: International Business Machines Corporation, Armonk, NY (US)

( * ) Notice: Subject to any disclaimer, the term of this patent is extended or adjusted under 35 U.S.C. 154(b) by 36 days.

(21) Appl. No.: 10/437,764

(22) Filed: May 14, 2003

(65) Prior Publication Data

US 2004/0227542 A1  Nov. 18, 2004

(51) Int. Cl.[7] ............................................. H03K 17/16
(52) U.S. Cl. ........................ 326/34; 327/544; 365/227
(58) Field of Search ............................. 326/33, 34, 83; 327/544; 365/227

(56) References Cited

U.S. PATENT DOCUMENTS 5,726,946 A * 3/1998 Yamagata et al. .......... 365/226
6,049,245 A * 4/2000 Son et al. ................... 327/544

* cited by examiner

Primary Examiner—Daniel D. Chang
(74) Attorney, Agent, or Firm—Robert M. Trepp; F. Chau & Associates, LLC

(57) ABSTRACT

A power gate structure and corresponding method are provided for controlling the ground connection of a logic circuit for a plurality of modes, where the power gate structure includes an NFET transistor, a PFET transistor in signal communication with the NFET transistor, source to source and drain to drain, respectively, a ground node in signal communication with the drains of the transistors, and a ground rail in signal communication with the sources of the transistors; and the corresponding method includes decoupling the logic circuit from the ground connection in a first or active mode, holding the logic circuit at about a threshold voltage above the ground connection in a second or state retention mode, and cutting off the current flow between the logic circuit and the ground connection in a third or non-state retentive mode.

23 Claims, 5 Drawing Sheets

DIGITAL LOGIC WITH REDUCED LEAKAGE

BACKGROUND

The present disclosure relates to Complementary Metal Oxide Semiconductor ("CMOS") integrated circuits and, more particularly, to CMOS implementations of Static Random Access Memories ("SRAM"), digital logic, and related methods for reducing parasitic leakage currents in memory and logic elements.

FIG. 1 illustrates a conventional CMOS SRAM storage cell indicated generally by the reference numeral 100 [1]. As shown in the figure, various parasitic leakage current paths exist between VDD and ground through the various devices. Paths in the solid line represent leakage through the gate nodes of the MOS devices, while subthreshold device source-to-drain leakage is represented by the dotted lines in the figure. As technology scales to deep submicron dimensions, these leakage currents can constitute a significant portion of total power during both standby and active modes. The gate leakage component leakage is a strong function of voltage potential between the gate and either the device source or drain terminal. The subthreshold leakage current is a strong function of device threshold voltage (Vt) and drain-to-source voltage potential, which modulates the Drain-Induced-Barrier Lowering effect (DIBL).

[1] "A Novel Powering-down Scheme for Low Vt CMOS Circuits", Kouichi Kumagai, Hiroaki Iwaki, Hiroshi Yoshida, Hismitsu Suzuki, Takashi Yamada, Susumu Kurosawa, 1998 Symposium on VLSI Circuits Technical Digest, IEEE, pp. 44–45.

FIG. 2 illustrates a conventional technique to dynamically reduce the supply voltage across a logic circuit during standby mode by interrupting the power supply and ground connections of an integrated circuit by a low leakage MOS switch (MPSW and MNSW), indicated generally by the reference numeral 200 [2]. The diodes DN and DP are added to the circuit to reduce and clamp the supply voltage potential to a lower voltage while the circuit is in a standby mode.

[2] "Standby Power Management for a 0.18 um Microprocessor", L. T. Clark, S. Demmons, N. Deutscher, F. Ricci, Proceedings of 2002 International Symposium on Low Power Electronics and Design, Monterey Calif., ACM, pp. 7–12.

The conventional technique illustrated in 200 has problems for voltage scaled devices. The diode is constructed by a P/N junction, which maintains a voltage drop of approximately 0.6V during normal conduction mode. If the supply voltage VDD is normally at 1.0V or less, the remaining small voltage (1.0V−0.6V=0.4V) can cause problems in maintaining the state of the circuit in the presence of noise. It also limits the amount the normal supply voltage can scale to less than the diode built-in potential of 0.6V. Another drawback of this approach is that it is not possible to control the diode voltage drop electronically to adjust the voltage potential across the internal circuits during the standby state because it is fixed by the physical limits of the diode characteristics.

This problem may be solved by using a complex voltage regulator, which uses a reference voltage to determine the virtual ground potential during standby mode. Such a voltage regulator, however, consumes chip area and is centrally located on the chip. The regulator must supply enough sink current to safely clamp the virtual VSS node in modes when the leakage current can be very high, such as under high temperature operation. Distribution of the Virtual VSS node must be done using wiring resources and can be inefficient for use in localized areas of the chip controlled independently.

FIG. 3 illustrates an example of a conventional circuit used to reduce the leakage current during standby mode using a complex regulator, and indicated generally by the reference numeral 300. In the circuit 300, the VSS ground connection is interrupted by the MOS switch M5 during standby mode, while an integrated voltage regulator is used to clamp and hold the floating VSS potential to a higher elevated voltage. During this mode, the PFET Nwell body connection is shorted to an externally generated supply that is higher than the normal VDD connection (IO VDD). This reduces the overall voltage potential across the microprocessor core circuit and reverse well biases both the PFET and NFET devices.

SUMMARY

These and other drawbacks and disadvantages of the prior art are addressed by digital logic with reduced leakage in accordance with embodiments of the present disclosure.

The power gate structure is provided for controlling the ground connection of a logic circuit for a plurality of modes, where the power gate structure includes an NFET transistor, a PFET transistor in signal communication with the NFET transistor, source to source and drain to drain, respectively, a ground node in signal communication with the drains of the transistors, and a ground rail in signal communication with the sources of the transistors.

The corresponding method for controlling the ground connection of a logic circuit for a plurality of modes includes coupling the logic circuit and the ground connection in a first or active mode, holding the logic circuit at about a threshold voltage above the ground connection in a second or state retention mode, and cutting off the current flow between the logic circuit and the ground connection in a third or non-state retentive mode.

These and other aspects, features and advantages of the present disclosure will become apparent from the following description of exemplary embodiments, which is to be read in connection with the accompanying drawings.

BRIEF DESCRIPTION OF THE DRAWINGS

The present disclosure teaches digital logic with reduced leakage in accordance with the following exemplary figures, in which.

DETAILED DESCRIPTION OF PREFERRED EMBODIMENTS

Figure 1:
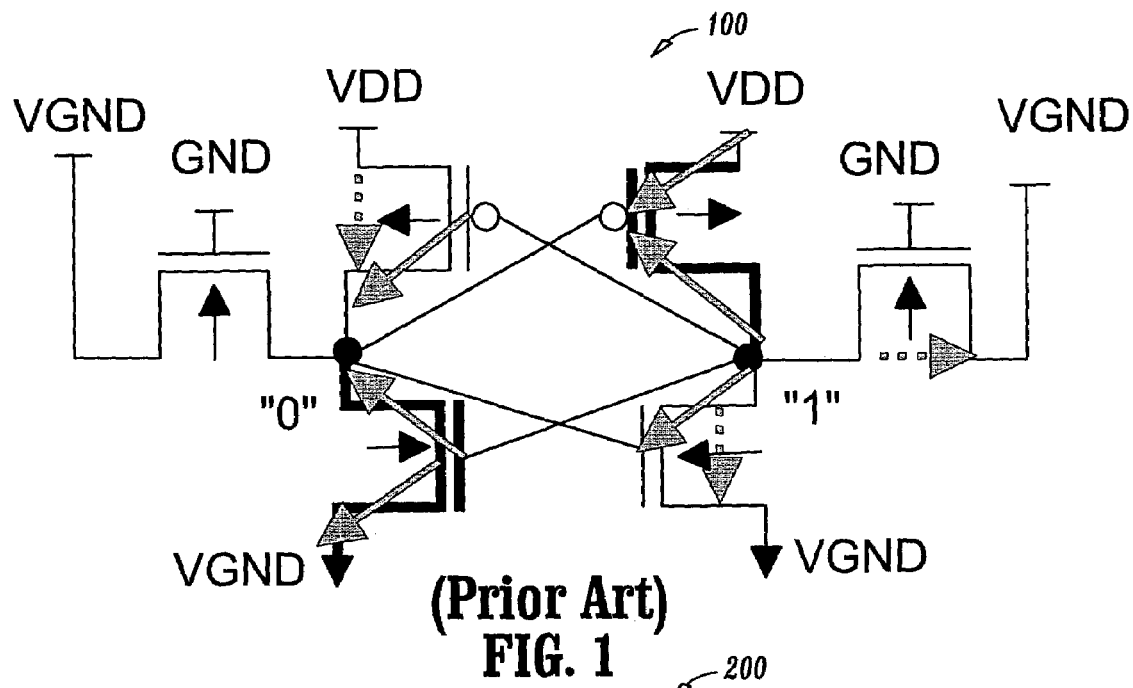
FIG. 1 is a schematic diagram showing a conventional SRAM cell.
Figure 2:
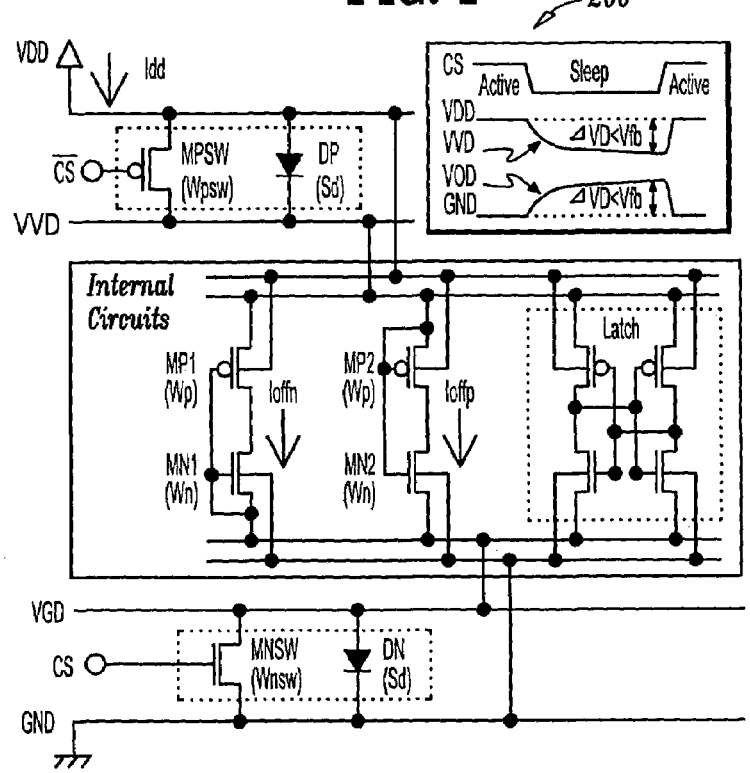
FIG. 2 is a schematic diagram showing a conventional virtual rail CMOS.
Figure 3:
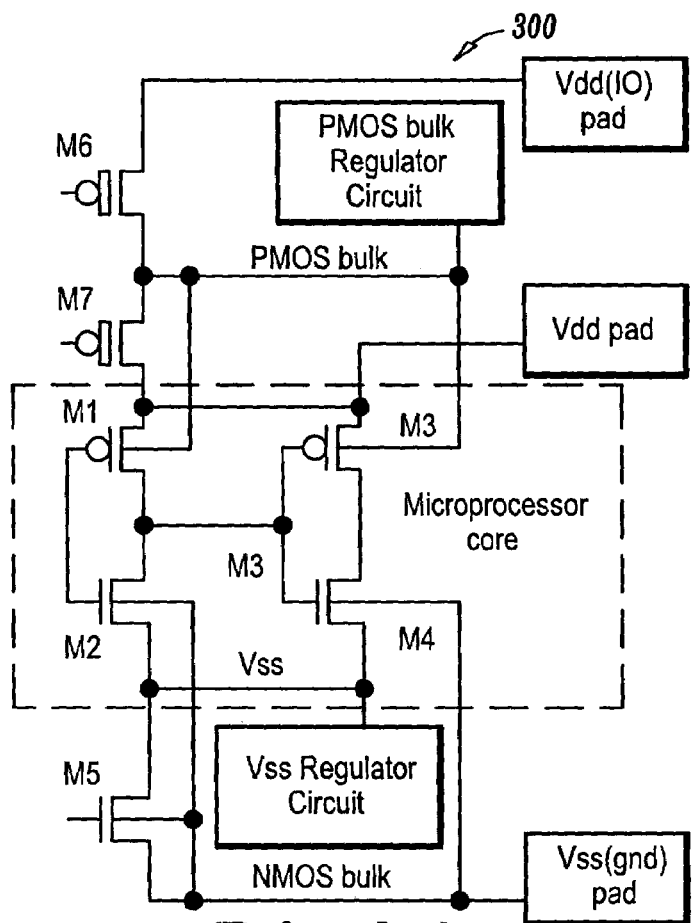
FIG. 3 is a schematic diagram showing a conventional regulated supply rail.
Figure 4:
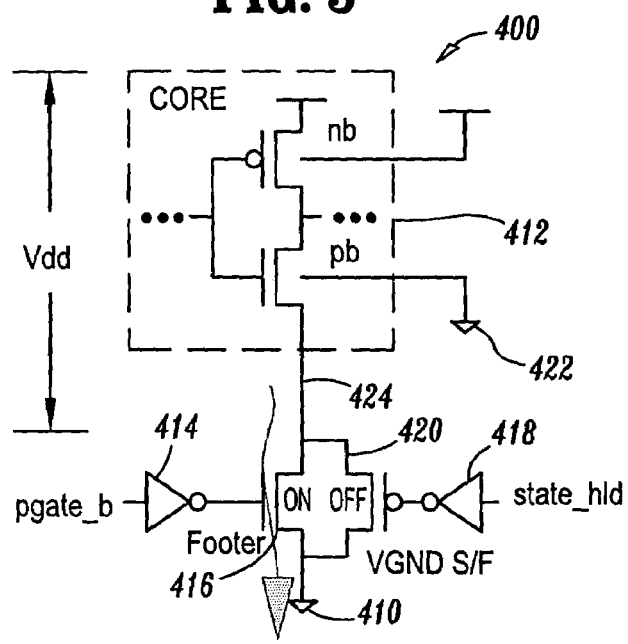
FIG. 4 is a schematic diagram showing a power gate structure in normal active mode operation according to an embodiment of the present disclosure.
Figure 5:
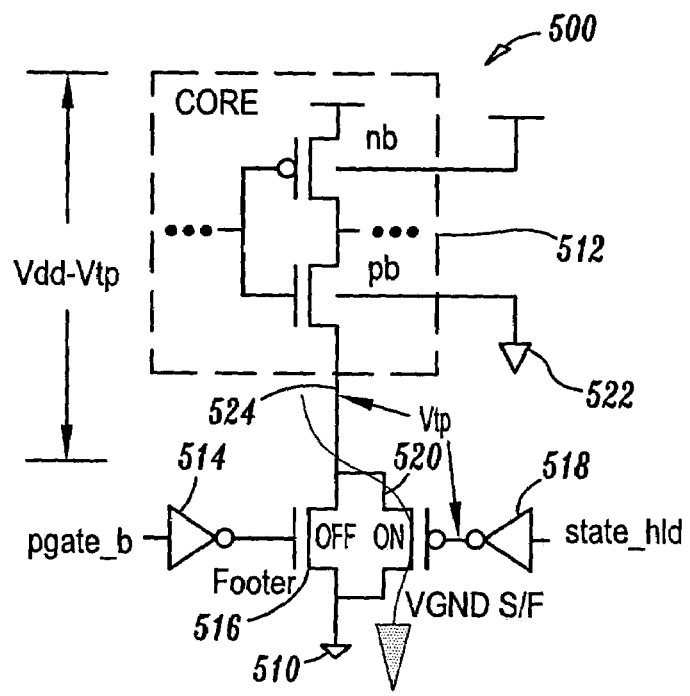
FIG. 5 is a schematic diagram showing a power gate structure in low leakage state retention mode according to an embodiment of the present disclosure.
Figure 6:
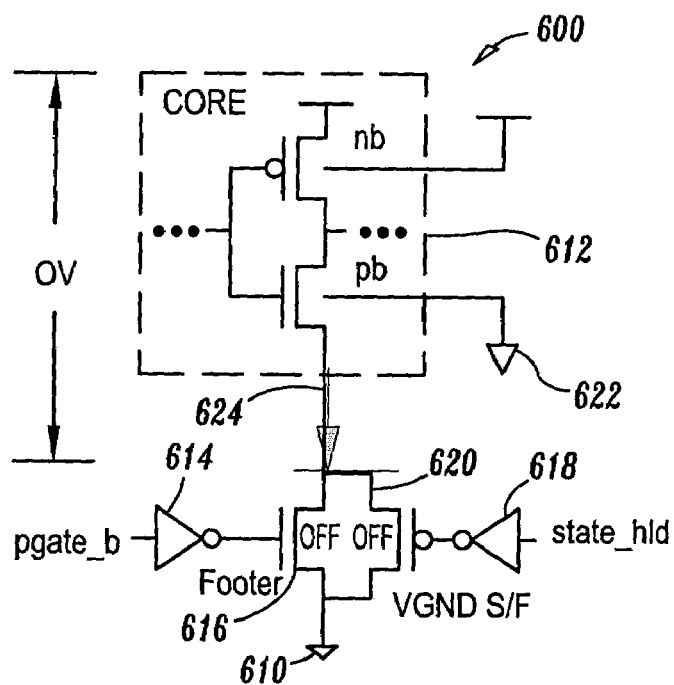
FIG. 6 is a schematic diagram showing a power gate structure in low leakage non-state retaining mode according to an embodiment of the present disclosure.

Embodiments of the presently disclosed apparatus and method provide a gate structure and distributed technique to clamp internal supply rails when they have been disconnected electrically from the supply or ground rails by MOS devices. Spatially connected devices provide efficient localized control of clamp voltage, and allow adjustment of the clamping voltage by means of an electrical signal. FIGS. 4, 5 and 6 show the presently disclosed power gate structure in various modes of operation, wherein like elements are indicated by like reference numerals in the several figures.

As shown in FIG. 4, a power gate is indicated generally by the reference numeral 400. The power gate 400 is used to decouple a real global ground potential node 410 from a circuit 412 in an active mode via a virtual ground rail 424. In this mode the signal pgate_b is asserted low at an inverter 414 to force an NFET footer transistor 416 into a low resistance conducting state, while state_hld is set low at an inverter 418 to turn off a PFET 420. During this mode, the NFET 416 is used to short the virtual ground rail 424 to the real global ground potential node 410, allowing the full VDD voltage to be seen across the logic circuit to allow high-speed operation. A body ground signal pb of the circuit 412 is coupled directly to a real global ground potential node 422.

Turning to FIG. 5, a circuit indicated generally by the reference numeral 500 is in a low leakage state retention mode. In this state retention mode, the signal pgate_b is asserted high at an inverter 514, and state_hld is asserted high at an inverter 518. This will turn off the NFET footer 516, and the PFET footer 520 will operate in the Source/Follower mode. In this mode the positive source node of the PFET 520 would be held a threshold voltage (Vtp) above the ground node 510. The voltage across the logic circuit is VDD-Vtp, causing a reduction of gate leakage and sub-threshold leakage in the logic circuit 512 because the drain to source voltage of the cut off transistors is lowered, thereby reducing the drain induced barrier-lowering effect. Further reduction in subthreshold leakage also occurs because the logic circuit NFET body connection (pb) is connected to the real ground, while its source node is raised by the PFET footer 520 source/follower device. The drain to body voltage of the logic circuit NFET is made negative, GND-Vtp, effectively reverse biasing the logic NFET devices, causing an increase in the NFET threshold voltages and further reducing the subthreshold parasitic leakage.

Control of the mode signals and modes as described above and depicted by illustrations 400 and 500 may be implemented so that switching between the modes is controlled by a circuit, software, human interface, other interfaces, or a combination of these. In certain applications of the power gate, the mode control may be implemented by a mode circuit that automatically selects the active and state retention modes to minimize leakage current, while ensuring rated performance of the core or logic circuit. One method for implementing this behavior is to set the power gate to state retention mode by default and to active mode only when the core circuit is required for computing. Mode logic for detecting an upcoming operation will deassert the pgate_b signal in time to ensure rated performance of the core or logic circuit when computation begins. Other implementations, while not specifically described herein, may be contemplated by those of ordinary skill in the pertinent art to ensure proper operation in accordance with the principles of the present disclosure.

FIG. 6 shows a circuit indicated generally by the reference numeral 600 in a non-state retentive mode. Here, the signal pgate_b is held high at the inverter 614 and the signal state_hld is held low at the inverter 618. In this mode, the current path is cut off from the ground node 610 and the voltage across the logic circuit 612 collapses and gives maximum leakage suppression of gate and subthreshold currents.

Alternate embodiment modifications to the circuits 400, 500 and 600 include making the both the PFET 420 and NFET 416 footer devices high threshold devices by an implant during circuit fabrication. A high threshold NFET 416 would reduce the parasitic leakage current through that device, and a high threshold PFET 420 would reduce the parasitic leakage through that device and also raise the virtual ground node 422 during a state-retentive mode.

Figure 7:
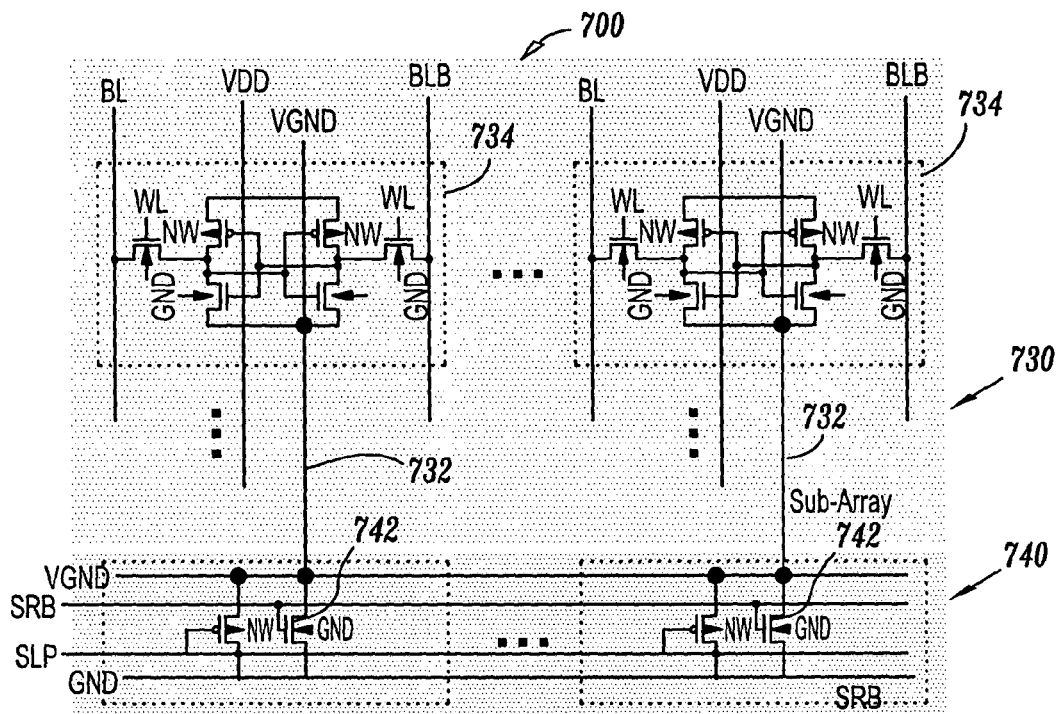
FIG. 7 is a schematic diagram showing a power gate structure operation in a static random access memory ("SRAM") array according to an embodiment of the present disclosure.

FIG. 7 shows a circuit similar to FIG. 6 and indicated generally by the reference numeral 700. Here, with application of the present teachings to static random access memory (SRAM) arrays 730, the new power gate structure 740 is made at the bottom of an SRAM subarray 730. The ground lines 732 of the SRAM subarray 730 are brought down from each SRAM cell 734 and connected to the new power gate circuit 740, denoted SRB. Low leakage array operation can be obtained by keeping signals SRB=low and SLP=low in the non-accessed state. In this mode the voltage across the SRAM cells 734 in the subarray 730 is reduced to VDD-Vtp, and the NFET devices in the memory array are reverse biased as described above. When a memory operation occurs, prior to complete address decoding, the SRB signal transitions to a high state and the ground 732 of the subarray is shorted to the real ground by the NFET device 742. This will allow the complete supply voltage (VDD) across the SRAM subarray 730 during the cell 734 access period, allowing high-speed operation.

Figure 8:
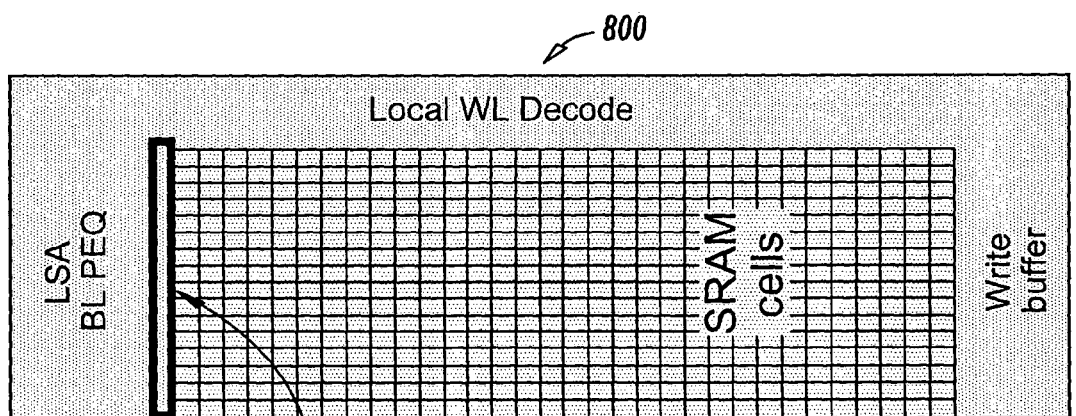
FIG. 8 is a schematic diagram showing the physical construction of the power gate structure in SRAM array according to an embodiment of the present disclosure.

Turning now to FIG. 8, a circuit 800 shows the physical location of the SRB circuits 840 below the SRAM subarray 730 of FIG. 7. The SRB circuits 840 have the indicated physical construction of the power gating structure in the SRAM array 700.

Figure 9:
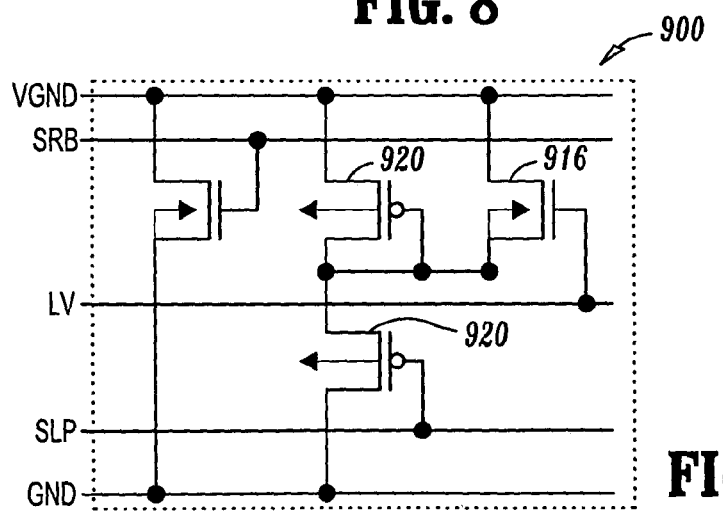
FIG. 9 is a schematic diagram showing an alternate power gate structure allowing electrically programmable voltage reduction in standby mode according to an embodiment of the present disclosure.

As shown in FIG. 9, an alternate version of the improved power gate device is indicated generally by the reference numeral 900. The alternate power gate device 900 uses a stack of PFET devices 920 to improve leakage reduction during standby modes. A parallel NFET device 916 can be used to bypass the top PFET device 920 and allow electrical programmability of the state retention voltage.

Figure 10:
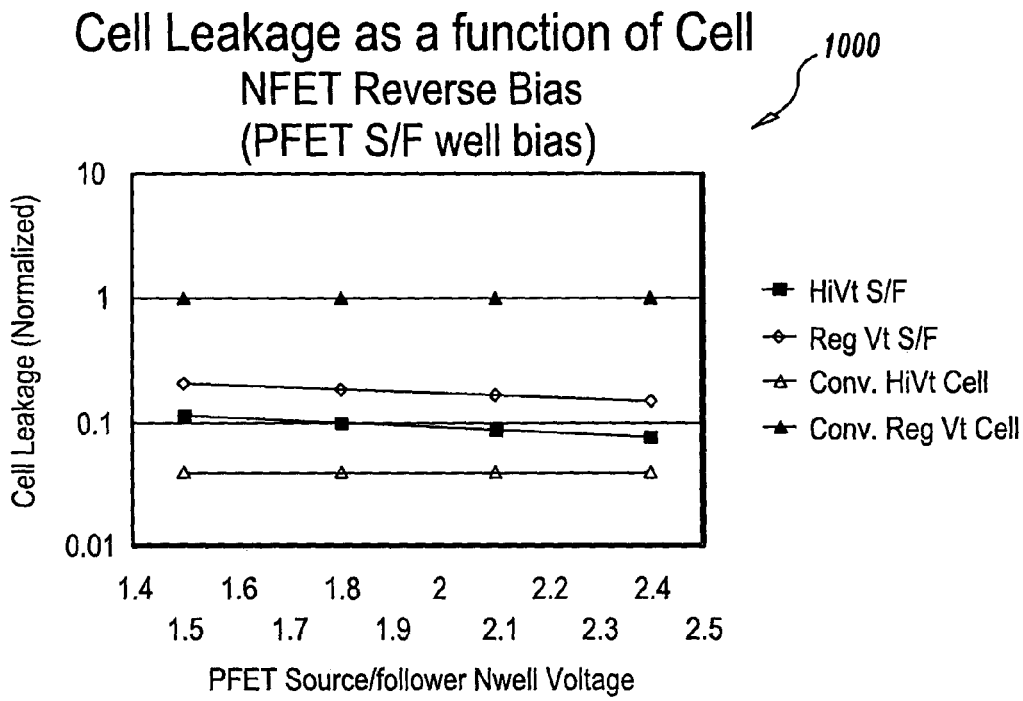
FIG. 10 is a graphical diagram showing normalized cell leakage as a function of reverse well bias on PFET footer devices according to an embodiment of the present disclosure.

Turning to FIG. 10, a graphical plot of normalized leakage reduction for an SRAM array is indicated generally by the reference numeral 1000. The plot 1000 shows the leakage reduction obtainable using the circuit 700 of FIG. 7 for an SRAM array and applying a reverse well bias to the PFET Nwell connection. This has the effect of raising the PFET threshold voltage, which would allow an electrical method to adjust the voltage (VDD-Vtp) in the SRAM array during standby mode. The well bias can also be applied in the forward direction to further reduce the amount of leakage.

Figure 11:
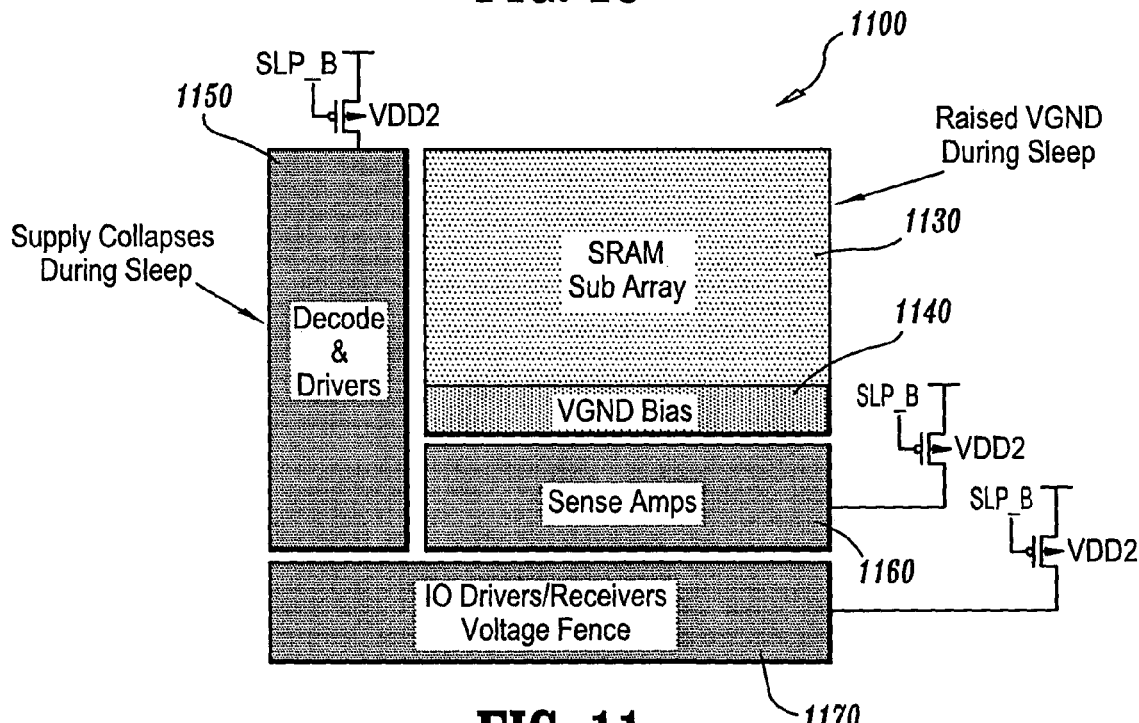
FIG. 11 is a schematic diagram showing a low leakage standby mode SRAM using conventional power gate structure on peripheral circuits and new power gate structure within the array to allow state retention during standby mode according to an embodiment of the present disclosure.

Turning now to FIG. 11, an exemplary SRAM is indicated generally by the reference numeral 1100. The SRAM 1100 includes the SRAM Sub-Array 1130, the VGND Bias 1140, a decode and drivers portion 1150, a sense amplifier portion 1160, and an I/O drivers and receivers voltage fence 1170. The SRAM 1100 uses the reduced leakage state-retaining power gate for the array memory elements and conventional PFET type power gating on the peripheral circuits. The peripheral circuits may not contain any useful state during standby modes and can be completely shut down.

Although illustrative embodiments have been described herein with reference to the accompanying drawings, it is to be understood that the present disclosure is not limited to those precise embodiments, and that various changes and modifications may be effected therein by one of ordinary skill in the pertinent art without departing from the scope or spirit of the present disclosure. All such changes and modifications are intended to be included within the scope of the present disclosure as set forth in the appended claims.

What is claimed is:

1. A power gate structure having a fixed supply voltage and an adjustable ground voltage, comprising:
    an NFET transistor;
    a PFET transistor electronically coupled with the NFET transistor, NFET drain to PFET source and NFET source to PFET drain, respectively;
    an adjustable virtual ground electronically coupled with the NFET drain and PFET source;
    a fixed global ground electronically coupled with the NFET source and PFET drain; and
    a logic circuit having a circuit ground electronically coupled with the virtual ground and a body ground electronically coupled with the global ground,
    wherein the virtual ground is adjustable to a clamping voltage between the fixed source voltage and the fixed global ground voltage by means of:
    adjusting the PFET source voltage in accordance with an electrical signal applied to the gate of the PFET in a source-follower mode; and
    adjusting the PFET threshold voltage by applying a reverse well bias to the PFET Nwell connection.

2. A power gate structure as defined in claim 1, further comprising a first inverter electronically coupled with the gate of the NFET transistor.

3. A power gate structure as defined in claim 1, further comprising a second inverter electronically coupled with the gate of the PFET transistor.

4. A power gate structure as defined in claim 1 wherein the logic circuit comprises at least one CMOS memory cell.

5. A power gate structure as defined in claim 1 wherein the power gate is disposed to electronically couple the virtual ground to the global ground in an active mode.

6. A power gate structure as defined in claim 1 wherein the power gate is disposed to hold the virtual ground at about a threshold voltage above the global ground in a state retention mode.

7. A power gate structure as defined in claim 1 wherein the power gate is disposed to electronically decouple the virtual ground from the global ground in a non-state retentive mode.

8. A power gate structure as defined in claim 1, further comprising a mode circuit electronically coupled with the logic circuit for detecting an upcoming operation in time to switch from a state retention mode to an active mode and ensure a rated performance of the logic circuit.

9. A power gate structure for controlling the ground connection of a logic circuit having a fixed supply voltage and an adjustable ground voltage for a plurality of modes while maintaining a body ground of the logic circuit at a fixed ground potential, the power gate structure comprising:
    coupling means for coupling the logic circuit to the fixed ground in a first or active mode;
    holding means for holding the ground connection of the logic circuit at about a threshold voltage above the fixed ground in a second or state retention mode; and
    decoupling means for cutting off the current flow between the logic circuit and the ground connection in a third or non-state retentive mode,
    wherein the ground connection of the logic circuit is adjustable to a clamping voltage between the fixed supply voltage and the fixed ground potential by means of:
    first adjusting means for adjusting a source voltage of the holding means in accordance with an electrical signal applied to a gate of the holding means in a source-follower mode; and
    second adjusting means for adjusting the threshold voltage of the holding means by applying a reverse well bias to an Nwell connection of the holding means.

10. A power gate structure as defined in claim 9 wherein the coupling means comprises:
    first asserting means for asserting a low signal at a first inverter electronically coupled with an NFET footer transistor for a low resistance conducting state;
    second asserting means for asserting a low signal at a second inverter electronically coupled with a PFET footer transistor to turn off the PFET footer transistor; and
    shorting means for shorting the logic circuit's virtual ground to a real global ground potential to allow a full voltage to be seen across the logic circuit and promote high-speed operation.

11. A power gate structure as defined in claim 9 wherein the holding means for holding the logic circuit at about a threshold voltage above the ground connection in the second or state retention mode comprises:
    first asserting means for asserting a high signal at a first inverter electronically coupled with an NFET footer transistor to turn off the NFET footer transistor;
    second asserting means for asserting a high signal at a second inverter electronically coupled with a PFET footer transistor to operate the PFET footer transistor in a source/follower mode; and
    holding means for holding the logic circuit's virtual ground at a threshold voltage above a real global ground potential causing a reduction of gate leakage and subthreshold leakage in the circuit.

12. A power gate structure as defined in claim 11, further comprising reverse biasing means for reverse biasing the NFET footer transistor to cause an increase in a threshold voltage of the NFET footer transistor and further reduce the subthreshold parasitic leakage.

13. A power gate structure as defined in claim 9 wherein cutting off the current flow between the logic circuit and the ground connection in a third or non-state retentive mode comprises:

first asserting means for asserting a high signal at a first inverter electronically coupled with an NFET footer transistor to turn off the NFET footer transistor;

second asserting means for asserting a low signal at a second inverter electronically coupled with a PFET footer transistor to turn off the PFET footer transistor; and cutting means for cutting off the current path between the logic circuit's virtual ground and a real global ground potential causing maximum leakage suppression of gate and subthreshold currents.

14. A power gate structure as defined in claim 9, further comprising mode means electronically coupled with the logic circuit for detecting an upcoming operation in time to switch from the state retention mode to the active mode and ensure a rated performance of the logic circuit.

15. A method of controlling the ground connection of a logic circuit having a fixed supply voltage and an adjustable ground voltage for a plurality of modes while maintaining a body ground of the logic circuit at a fixed ground potential, the method comprising:

coupling the logic circuit to the fixed ground in a first or active mode;

holding the logic circuit at about a threshold voltage above the fixed ground in a second or state retention mode;

cutting off the current flow between the logic circuit and the fixed ground in a third or non-state retentive mode; and clamping the ground connection of the logic circuit to a clamping voltage between the fixed source voltage and the fixed global ground voltage by:

adjusting a PFET source voltage in accordance with an electrical signal applied to the gate of the PFET in a source-follower mode; and adjusting the PFET threshold voltage by applying a reverse well bias to the PFET Nwell connection.

16. A method as defined in claim 15 wherein coupling the logic circuit to the fixed ground in the first or active mode comprises:

asserting a low signal at a first inverter electronically coupled with an NFET footer transistor for a low resistance conducting state;

asserting a low signal at a second inverter electronically coupled with a PFET footer transistor to turn off the PFET footer transistor; and shorting the logic circuit's virtual ground to a real global ground potential to allow a full voltage to be seen across the logic circuit and promote high-speed operation.

17. A method as defined in claim 15 wherein holding the logic circuit at about a threshold voltage above the ground connection in the second or state retention mode comprises:

asserting a high signal at a first inverter electronically coupled with an NFET footer transistor to turn off the NFET footer transistor;

asserting a high signal at a second inverter electronically coupled with a PFET footer transistor to operate the PFET footer transistor in a source/follower mode; and holding the logic circuit's virtual ground at a threshold voltage above a real global ground potential causing a reduction of gate leakage and subthreshold leakage in the circuit.

18. A method as defined in claim 17, further comprising reverse biasing the NFET footer transistor to cause an increase in a threshold voltages of the NFET footer transistor and further reduce the subthreshold parasitic leakage.

19. A method as defined in claim 15 wherein cutting off the current flow between the logic circuit and the ground connection in a third or non-state retentive mode comprises:

asserting a high signal at a first inverter electronically coupled with an NFET footer transistor to turn off the NFET footer transistor;

asserting a low signal at a second inverter electronically coupled with a PFET footer transistor to turn off the PFET footer transistor; and cutting off the current path between the logic circuit's virtual ground and a real global ground potential causing maximum leakage suppression of gate and subthreshold currents.

20. A method as defined in claim 15, further comprising switching between at least two of the three modes in accordance with at least one of a circuit, software, human interface or other interface.

21. A method as defined in claim 20 wherein the switching is in accordance with a mode circuit for automatically selecting between the active mode and the state retention mode to minimize leakage current while ensuring a rated performance of the logic circuit.

22. A method as defined in claim 21 wherein the mode circuit sets the power gate to the state retention mode by default and sets the power gate to the active mode when the logic circuit is required for computing.

23. A method as defined in claim 22 wherein the mode circuit comprises logic for detecting an upcoming operation in time to switch from the state retention mode to the active mode and ensure a rated performance of the logic circuit.

* * * * *